(12) United States Patent
Wester

(10) Patent No.: US 6,924,084 B2
(45) Date of Patent: Aug. 2, 2005

(54) ELECTRON EXPOSURE TO REDUCE LINE EDGE ROUGHNESS

(75) Inventor: Neil S. Wester, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 118 days.

(21) Appl. No.: 10/404,272

(22) Filed: Mar. 31, 2003

(65) Prior Publication Data

US 2004/0191701 A1 Sep. 30, 2004

(Under 37 CFR 1.47)

(51) Int. Cl.⁷ .................................................. G03C 5/00
(52) U.S. Cl. ...................... 430/296; 430/327; 430/328; 430/330; 430/942
(58) Field of Search ................................ 430/296, 327, 430/328, 330, 942

(56) References Cited

U.S. PATENT DOCUMENTS

| | | | | |
|---|---|---|---|---|
| 5,942,373 A | * | 8/1999 | Chou et al. | 430/296 |
| 6,340,556 B1 | * | 1/2002 | Wong | 430/296 |
| 6,358,670 B1 | * | 3/2002 | Wong et al. | 430/296 |
| 6,753,129 B2 | * | 6/2004 | Livesay et al. | 430/296 |
| 2002/0022195 A1 | * | 2/2002 | Nakano et al. | 430/311 |

* cited by examiner

*Primary Examiner*—Christopher G. Young
(74) *Attorney, Agent, or Firm*—Blakely, Sokoloff, Taylor & Zafman LLP

(57) ABSTRACT

The present invention describes a method including providing a substrate; forming a photoresist on the substrate; performing a post-apply bake on the photoresist; exposing the photoresist to actinic radiation; performing a post-exposure bake on the photoresist; developing the photoresist; and performing electron exposure on the photoresist to reduce line edge roughness.

10 Claims, 1 Drawing Sheet

ELECTRON EXPOSURE TO REDUCE LINE EDGE ROUGHNESS

BACKGROUND OF THE INVENTION

1. Field of the Invention

The present invention relates to the field of semiconductor integrated circuit (IC) manufacturing, and more specifically, to a method of reducing line edge roughness (LER) of a feature in photoresist.

2. Discussion of Related Art

The manufacturing of IC devices involves the sequential processing of a wafer to form or remove materials for each layer of the wafer. Various materials may be formed by processes, such as oxidation, chemical vapor deposition, sputter deposition, ion implantation, and electroplating. Certain materials may be removed, partially or completely, by processes, such as wet etch, dry etch, or polishing.

Photolithogaphy may be performed together with some of these processes to selectively process certain portions of the wafer. Photolithogaphy may involve about 35 masks to pattern all of the layers on the wafer. However, only those masks which are used for layers that define the features in the IC design having the tightest groundrules are considered critical. The critical layers typically include isolation, gate, contact, and first metal.

A mask may be fabricated by depositing an opaque material, such as chrome, on a transparent substrate, such as quartz, and then etching the chrome to form features that are 4 times larger than the desired size on the wafer.

The wafer is covered with a material called photoresist that is sensitive to radiation. An exposure tool, such as a wafer scanner, optically reduces the features 4 times while projecting radiation of the appropriate wavelength through the mask so as to print a latent image with the correct dimensions on the wafer. Many parameters of an IC device are monitored during fabrication to assure that the device will meet the performance and reliability specifications.

In particular, the performance of a microprocessor is strongly dependent on the channel length of the devices in the microprocessor. The channel length is determined by the critical dimension (CD) of the gate. The processes of photolithography and etch are used to define the gate CD during the fabrication of the microprocessor on a wafer.

The yield in fabricating a microprocessor is strongly impacted by variability in gate CD of the devices formed across the wafer. CD variability includes line edge roughness (LER). As gate CD is progressively scaled down with each new generation of a microprocessor, LER consumes an increasingly larger portion of the overall CD error budget.

Thus, what is needed is a method of reducing line edge roughness of a feature in photoresist.

DETAILED DESCRIPTION OF THE PRESENT INVENTION

Figure 1:
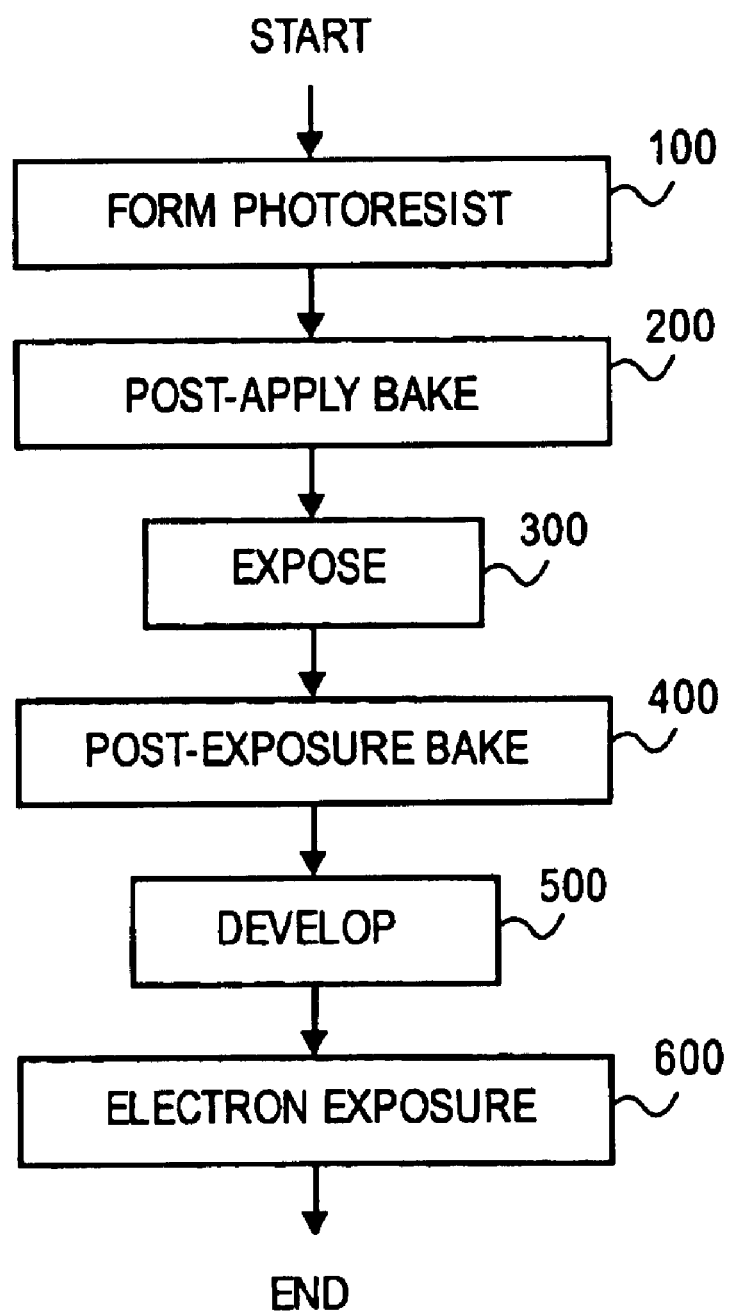
FIG. 1 is an illustration of a flowchart of an embodiment of a method of reducing line edge roughness of a feature in photoresist according to the present invention.

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes a method of using electron exposure to improve line edge roughness (LER) of a feature in photoresist. A flowchart of an embodiment of the present invention is shown in FIG. 1.

A chemically-amplified (CA) photoresist, such as a CA optical photoresist, is applied on a substrate, such as a wafer, in step 100. A track tool may be used to spin the substrate and coat the photoresist. In an embodiment of the present invention, the photoresist has a thickness that may be selected from a range of about 50–125 nm. In another embodiment of the present invention, the photoresist has a thickness that may be selected from a range of about 125–300 nm.

In an embodiment of the present invention, an antireflective coating (ARC) may be used. The ARC may be a bottom ARC (BARC) or a top ARC (TARC). The thickness of the ARC depends on the optical constants of the ARC and the photoresist as well as the thickness of the photoresist. The thickness of the ARC may be equivalent to about half of the thickness of the photoresist or less. In an embodiment of the present invention, the bottom ARC may have a thickness of about 30–70 nm.

The photoresist is post-apply baked (PAB) in step 200. In an embodiment of the present invention, the photoresist may be baked at about 80–120 degrees Centigrade for about 30–60 seconds.

The photoresist is exposed in step 300 to actinic radiation. In an embodiment of the present invention, the actinic radiation is light with a wavelength of about 193 nm, such as provided by an Argon Fluoride (ArF) excimer laser source. In another embodiment of the present invention, the actinic radiation is light with a wavelength of about 157 nm, such as provided by a Fluorine ($F_2$) excimer laser source.

The exposure may be performed in a wafer stepper or a wafer scanner with a numerical aperture (NA) of about 0.65–0.85 and a partial coherence (sigma) of about 0.6–0.8. The exposure may be performed using conventional illumination or off-axis illumination, such as annular illumination or quadrupole illumination. The exposure may include a binary mask or a phase-shifting mask (PSM).

In an embodiment of the present invention, a dose of about 3–8 $mJ/cm^2$ may be used. In another embodiment of the present invention, a dose of about 8–25 $mJ/cm^2$ may be used. Exposure to photons causes photoacid generator (PAG) in the photoresist to decompose and generate acid.

The photoresist is post-exposure baked (PEB) in step 400. In an embodiment of the present invention, the photoresist is baked at about 120–150 degrees Centigrade for about 60–120 seconds. The post-exposure bake thermally activates an acid-catalyzed reaction in which an acid-labile protecting group on the polymer backbone is cleaved by acid and the polarity of the polymer is changed from lipophilic to hydrophilic. During the deprotecting process, more acid is created as a byproduct, thus continuing the acid-catalyzed deprotection cycle.

Activation energy depends on reactivity of the acid-labile protecting group to the photo-generated acid. In an embodiment of the present invention, the CA photoresist may be designed to have high activation energy (low reactivity) which allows higher temperatures for the post-apply bake and the post-exposure bake. A high-activation energy CA photoresist is more manufacturable and has a more stable shelf-life.

In another embodiment of the present invention, the CA photoresist may be designed to have low activation energy (high reactivity) which allows lower temperatures for the post-apply bake and the post-exposure bake. A low-activation energy CA photoresist is less affected by time delay after the exposure and before the post-exposure bake.

In still another embodiment, a post-exposure bake is not used for a low-activation energy CA photoresist.

The photoresist is developed in step 500. The exposed portions of the photoresist become soluble in an aqueous alkaline developer, such as tetramethyl-ammonium hydroxide (TMAH) with a concentration such as 0.26 N. The sidewall angle in the photoresist may be about 84–89 degrees after develop.

The photoresist is exposed to electrons in step 600. Optimization of the energy and the dose of the electron exposure depends on various factors, such as the thickness of the photoresist, as well as the size and the shape of the features formed in the photoresist. Properties of the photoresist and the underlying and surrounding materials to be considered include electron density, thermal conductivity, and electrical conductivity.

Energy is equivalent to a product of an acceleration voltage and a beam current so optimization of the acceleration voltage and the beam current may be performed. Various energies may be used for the electron exposure.

A higher acceleration voltage will increase the penetration depth of the incident electrons so a higher acceleration voltage may be used to expose a thicker photoresist. In an embodiment of the present invention, an acceleration voltage of about 0.3–1.0 keV is used. In another embodiment of the present invention, an acceleration voltage of about 1.0–8.0 keV may be used.

The beam current should not be too high. In an embodiment of the present invention, charging of the photoresist is prevented during the electron exposure.

In a first embodiment of the present invention, heating of the photoresist is prevented during the electron exposure. In a second embodiment of the present invention, outgassing of the photoresist is prevented during the electron exposure. In a third embodiment of the present invention, crosslinking of the photoresist is prevented during the electron exposure.

The photoresist should be maintained at a certain temperature during the electron exposure. In an embodiment of the present invention, the temperature during electron exposure is selected from a range of about 10–15 degrees Centigrade. In another embodiment of the present invention, the temperature during electron exposure is selected from a range of about 15–20 degrees Centigrade.

Dose is equivalent to a product of the beam current and the exposure time. Various doses may be used for the electron exposure. A higher dose may be used for a larger volume of photoresist. In an embodiment of the present invention, an isolated space in photoresist may have a larger volume of photoresist than an isolated line of photoresist. In another embodiment of the present invention, nested features (multiple lines and spaces) may have a larger volume of photoresist than an isolated line of photoresist.

In an embodiment of the present invention, a dose of about 10–50 uC/cm$^2$ is used for electron exposure. In another embodiment of the present invention, a dose of about 50–200 uC/cm$^2$ may be used for electron exposure.

Various pressures may be used for the electron cure. In an embodiment of the present invention, a pressure of about 10–100 millitorr (soft vacuum) may be used.

Exposure of the photoresist to electrons reduces the line edge roughness by about 30–60% (3-sigma). Line edge roughness may include notches (smaller CD) and protrusions (larger CD). The effect on the device, such as at the gate level, is more serious for notches than for protrusions.

In an embodiment of the present invention, electron exposure is used to reduce line edge roughness in a photoresist without reducing CD. In another embodiment of the present invention, electron exposure is used to reduce line edge roughness in a photoresist without reducing volume of the photoresist.

In another embodiment of the present invention, electron exposure reduces line edge roughness in a photoresist after etch. The reduction in line edge roughness (3-sigma) is usually smaller for final check CD (FCCD) than for develop check CD (DCCD). Develop check CD is the CD of the feature after develop. Final check CD is the CD of the feature after etch.

In an embodiment of the present invention, the electron exposure may be performed before develop of the photoresist (not shown). In another embodiment of the present invention, the electron exposure may be performed between post-exposure bake and develop (not shown). In still another embodiment of the present invention, the electron exposure may be performed twice: once with a first set of conditions before develop and once with a second set of conditions after develop (not shown).

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a method of using electron exposure to improve line edge roughness (LER) of a feature in photoresist.

What is claimed is:

1. A method comprising:

providing a substrate;

forming a photoresist on said substrate;

performing a post-apply bake on said photoresist;

exposing said photoresist to actinic radiation;

performing a post-exposure bake on said photoresist;

developing said photoresist; and performing electron exposure on said photoresist with a first set of conditions before develop and with a second set of conditions after develop to reduce line edge roughness.

2. The method of claim 1 wherein charging of said photoresist is prevented during said electron exposure.

3. The method of claim 1 wherein heating of said photoresist is prevented during said electron exposure.

4. The method of claim 1 wherein outgassing of said photoresist is prevented during said electron exposure.

5. The method of claim 1 wherein crosslinking of said photoresist is prevented during said electron exposure.

6. The method of claim 1 wherein an acceleration voltage of 0.3–1.0 keV is used for said electron exposure.

7. The method of claim 1 wherein said photoresist is maintained at a temperature selected from a range of about 10–15 degrees Centigrade during said electron exposure.

8. The method of claim 1 wherein a dose of about 10–50 uC/cm$^2$ is used for said electron exposure.

9. The method of claim 1 wherein said line edge roughness is reduced by about 30–60% (3-sigma).

10. The method of claim 1 wherein a reduction in said line edge roughness of said photoresist is smaller for final check CD than for develop check CD.

* * * * *